US007379011B2

United States Patent
Ham et al.

(10) Patent No.: US 7,379,011 B2
(45) Date of Patent: May 27, 2008

(54) LOSSLESS NONLINEAR ANALOG GAIN CONTROLLER IN IMAGE SENSOR AND MANUFACTURING METHOD THEREOF

(75) Inventors: Seog-heon Ham, Suwon-si (KR); Gunhee Han, Goyang-si (KR)

(73) Assignee: Samsung Electronics, Co. Ltd., Suwon-Si (KR)

( * ) Notice: Subject to any disclaimer, the term of this patent is extended or adjusted under 35 U.S.C. 154(b) by 0 days.

(21) Appl. No.: 11/508,616

(22) Filed: Aug. 23, 2006

(65) Prior Publication Data

US 2007/0046513 A1 Mar. 1, 2007

(30) Foreign Application Priority Data

Aug. 24, 2005 (KR) ............... 10-2005-0078046

(51) Int. Cl.
*H03M 1/58* (2006.01)
(52) U.S. Cl. ............ 341/170; 341/169; 341/128; 341/129
(58) Field of Classification Search ........ 341/118, 341/155, 167–170
See application file for complete search history.

(56) References Cited

U.S. PATENT DOCUMENTS

| 5,920,274 | A | * | 7/1999 | Gowda et al. ........... 341/155 |
| 6,271,785 | B1 | * | 8/2001 | Martin et al. ........... 341/169 |
| 6,545,624 | B2 | * | 4/2003 | Lee et al. ............... 341/155 |
| 6,670,904 | B1 | * | 12/2003 | Yakovlev ............... 341/167 |
| 6,943,719 | B2 | * | 9/2005 | Yun et al. .............. 341/155 |
| 7,075,474 | B2 | * | 7/2006 | Yamagata et al. ....... 341/169 |
| 7,129,883 | B2 | * | 10/2006 | Muramatsu et al. ..... 341/164 |
| 7,230,558 | B2 | * | 6/2007 | Lim ...................... 341/155 |
| 7,265,329 | B2 | * | 9/2007 | Henderson et al. ...... 250/208.1 |
| 2002/0113887 | A1 |   | 8/2002 | Iimura et al. ........... 348/310 |
| 2005/0057389 | A1 | * | 3/2005 | Krymski ................ 341/169 |
| 2007/0008206 | A1 | * | 1/2007 | Tooyama et al. ....... 341/155 |

FOREIGN PATENT DOCUMENTS

EP 1 298 800 A1 4/2003

* cited by examiner

*Primary Examiner*—Linh V. Nguyen
(74) *Attorney, Agent, or Firm*—F. Chau & Associates, LLC.

(57) ABSTRACT

An image sensor comprises an active pixel sensor (APS) array, a first analog-to-digital converter (ADC), and a ramp signal generator. The APS array has includes a plurality of pixels of arranged in a second order two-dimensional matrix, and wherein the APS array generates a reset signal and an image signal for each pixel of selected columns. The first ADC has includes correlated double sampling (CDS) circuits for each column of the APS array, and wherein the first ADC generates a digital code corresponding to the difference between the reset signal and the image signal using an output ramp signal that is applied to the CDS circuits for each column. The ramp generator generates the output ramp signal in which a low illumination portion and a high illumination portion have different slopes.

35 Claims, 6 Drawing Sheets

US 7,379,011 B2

LOSSLESS NONLINEAR ANALOG GAIN CONTROLLER IN IMAGE SENSOR AND MANUFACTURING METHOD THEREOF

CROSS-REFERENCE TO RELATED PATENT APPLICATION

This application claims priority to Korean Patent Application No. 10-2005-0078046, filed on Aug. 24, 2005, the disclosure of which is herein incorporated by reference in its entirety.

BACKGROUND OF THE INVENTION

1. Technical Field

The present disclosure relates to an image sensor and, more particularly, to a lossless non-linear analog gain controller in a CMOS image sensor (CIS) type image sensor.

2. Discussion of Related Art

CMOS image sensors are commonly used in portable cameras, digital still cameras, web cameras and the like to convert an image into a digital signal. The digital image signal that is output from the CMOS image sensor contains red, green, and blue image data. The digital image signal is processed to drive a display device such as a liquid crystal display.

A CMOS image sensor uses a correlated double sampling (CDS) method and uses a ramp signal to generate a digital signal from the difference between a reset signal and an image signal which are sampled according to the CDS method. That is, the CMOS image sensor picks up the difference between the reset signal and the image signal that varies based on illumination conditions, and generates a digital code corresponding to the difference. The digital code varies depending on the slope of the ramp signal under the same illumination conditions. To maintain constant luminosity or brightness under the same illumination conditions, the ramp signal has to be constant when the image acquired by the CMOS image sensor is displayed on a display device.

However, when the scene's dynamic range is equal to the sensor's dynamic range, a method of controlling an analog gain by keeping the ramp signal constant may cause data loss, for example, by saturating highlights when increasing the analog gain to brighten shadows.

Many CMOS image sensors have a pixel array which exhibits a linear response to light. Recently, sensors including non-linear analog pixels or smart pixels have been introduced to increase the dynamic range of the sensors. However, a log sensor suffers from excessive fixed pattern noise (FPN) when transistors in the pixel array are mismatched. Noise sensitivity and image quality may deteriorate since the CDS method cannot be used, due to the continuous operation of the log sensor. In addition, the pixel size becomes large due to the number of transistors in the pixel array.

SUMMARY OF THE INVENTION

According to an exemplary embodiment of the present invention, an image sensor comprises an active pixel sensor (APS) array, a first analog-to-digital converter (ADC), and a ramp signal generator. The APS array includes a plurality of pixels arranged in a two-dimensional matrix, wherein the APS array generates a reset signal and an image signal for each pixel of selected columns. The first ADC includes correlated double sampling (CDS) circuits for each column of the APS array, wherein the first ADC generates a digital code corresponding to the difference between the reset signal and the image signal using an output ramp signal that is applied to the CDS circuits for each column. The ramp signal generator generates the output ramp signal in which a low illumination portion and a high illumination portion have different slopes.

The ramp signal generator may decrease the slope of the output ramp signal in the low illumination portion and may increase the slope of the output ramp signal in the light illumination portion.

According to an exemplary embodiment of the present invention, the ramp signal generator generates folding currents for a voltage higher than a median voltage and a voltage lower than the median voltage, respectively, by referencing another calibrated ramp signals and a median voltage corresponding to the half amplitude of the calibrated ramp signal, and generates the output ramp signal based on the generated folding current.

According to an exemplary embodiment of the present invention, a ramp signal generator comprises a second ADC generating a reference code using a feedback of a calibrated ramp signal; a tracking unit generating an analog ramp signal as a result of a comparison of a digital target code with a reference code; a first ramp generator generating the calibrated ramp signal based on the ramp input signal; a non-linear analog gain controller generating folding currents for a voltage higher than a median voltage and a voltage lower than the median voltage, respectively, based on the first ramp signal and the median voltage equal to the median amplitude of the first ramp signal; and a second ramp generator generating the output ramp signal based on the folding current and the ramp input signal.

The reference CDS input voltages may comprise a first voltage and a second voltage, wherein at least one of the first voltage and the second voltage is equal to the median voltage.

A base voltage used in generating the ramp signals, the first and second voltages, the median voltage, and an input voltage required for each color channel may be supplied from voltages divided by a single resistor string.

According to an exemplary embodiment of the present invention, a method of driving an image sensor comprises: generating a reset signal and an image signal for each pixel of a selected column in an active pixel sensor (APS) array including a plurality of pixels arranged in a two-dimensional matrix; generating a pulse width signal corresponding to a difference between the reset signal and the image signal using an output ramp signal in correlated double sampling (CDS) circuits of each column of the APS array, and generating digital data corresponding to the pulse width signal; generating a reference code that is a digital code corresponding to reference analog input voltages by receiving feedback of the calibrated ramp signal; generating a calibrated ramp signal as a result of a comparison of a digital target code corresponding to a median value in the digital code range with the reference code; generating a folding current using the calibrated ramp signal and a non-linear analog gain controller; and generating the output ramp signal by applying the folding current to a ramp generator.

The output ramp signal may have a small slope in a low illumination portion and a large slope in a high illumination portion.

According to an exemplary embodiment of the present invention, generating the output ramp signal comprises: generating a reference code corresponding to reference CDS analog input voltages by receiving a feedback of a calibrated ramp signal; generating an analog ramp input signal as a result of a comparison of a digital target code with the reference code; generating the calibrated ramp signal based on the ramp input signal; generating folding currents for a voltage higher than a median voltage and a voltage lower than the median voltage, respectively, based on the first ramp signal and the median voltage corresponding to the half amplitude of the first ramp signal; and generating the output ramp signal based on the folding current and the ramp input signal.

According to an exemplary embodiment of the present invention, generating the folding current comprises: generating a bias voltage; generating a calibrated input of a median voltage using a predetermined weighted value for the first ramp signal; generating a first current based on the first ramp signal, the calibrated input, and the bias voltage; generating a second current based on the first ramp signal, the calibrated input, and the bias voltage; generating the folding current by subtracting the second current from the first current.

BRIEF DESCRIPTION OF THE DRAWINGS

The present invention will become readily apparent to those of ordinary skill in the art when descriptions of exemplary embodiments thereof are read with reference to the accompanying drawings.

DESCRIPTION OF EXEMPLARY EMBODIMENTS

Figure 1:
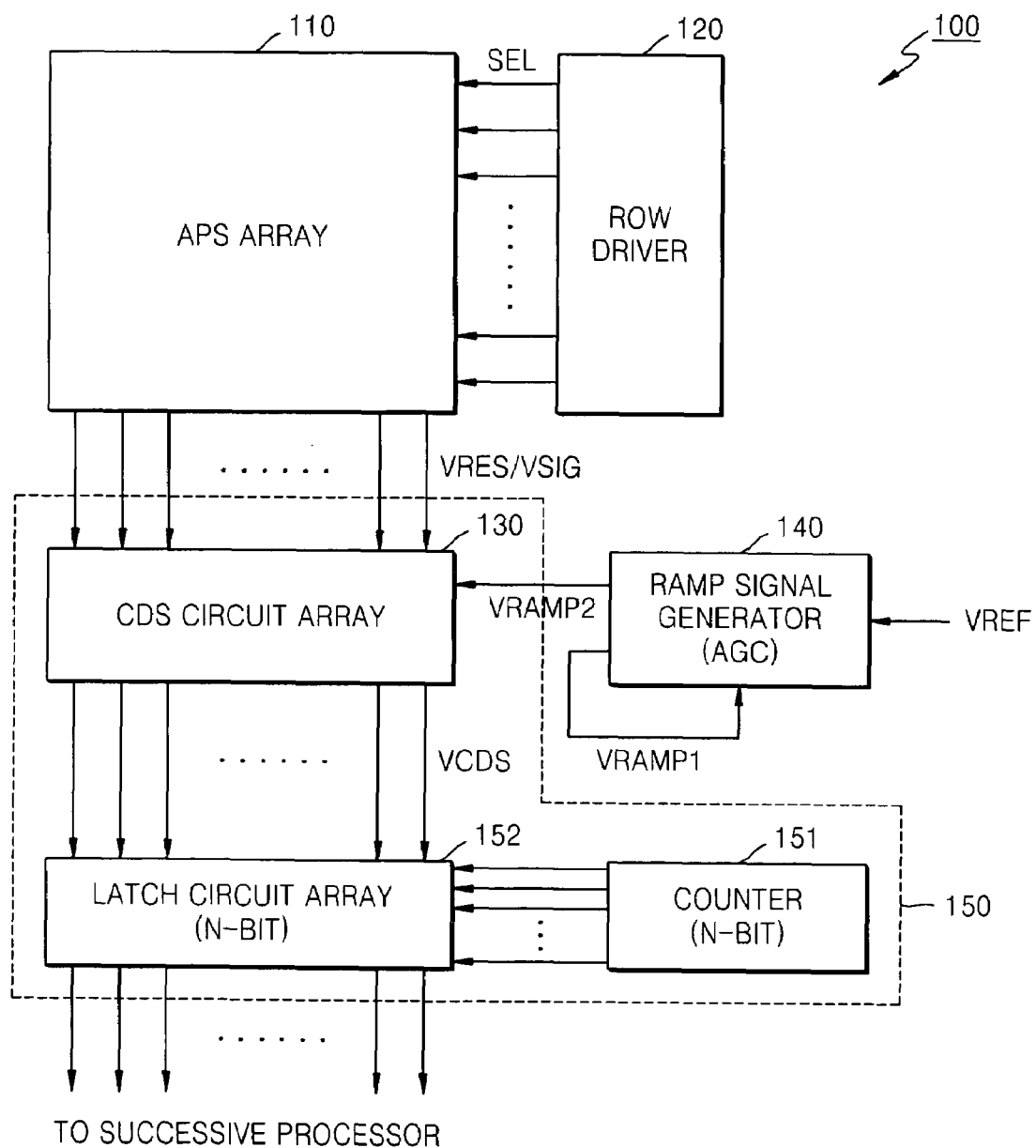
FIG. 1 shows an image sensor according to an exemplary embodiment of the present invention.

Hereinafter, exemplary embodiments of the present invention will be described in detail with reference to the accompanying drawings. Like reference numerals refer to similar or identical elements throughout the description of the figures.

FIG. 1 shows a CMOS image sensor 100 according to an exemplary embodiment of the present invention. Referring to FIG. 1, the image sensor 100 includes an active pixel sensor (APS) array 110, a row driver 120, a ramp signal generator 140, and a first analog-to-digital converter (ADC) 150. The first ADC 150 includes a correlated double sampling (CDS) circuit array 130.

The row driver 120 receives a control signal from a row decoder (not shown). A column decoder (not shown) controls an output of pixel data stored in the latch circuit array 152. The image sensor 100 may include a control unit (not shown) which generates overall timing control signals for the image sensor 100, including the first ADC 150 having the CDS circuit array 130 and the ramp signal generator 140.

Figure 2:
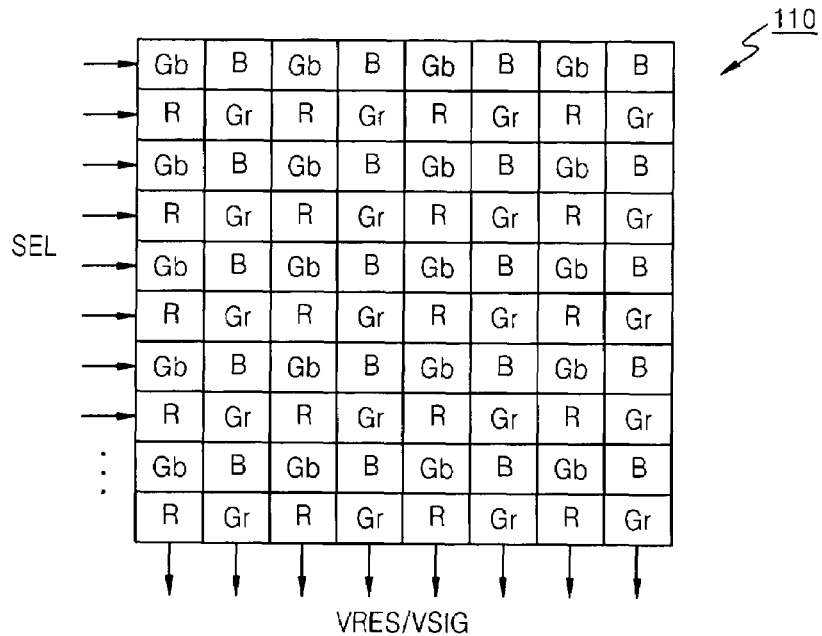
FIG. 2 shows a color filter pattern of the active pixel sensor array of FIG. 1, according to an exemplary embodiment of the present invention.

FIG. 2 shows a color filter pattern of the APS array 110 of FIG. 1, according to an exemplary embodiment of the present invention. The image sensor 100 may be a color image sensor. As shown in FIG. 2, color filters are installed on second order matrix type pixels forming the APS array 110, to pass only light of predetermined colors. At least three types of color filters are provided. The color filter array may be arranged in a Bayer pattern, in which two-color patterns of red R and green Gr filters and two-color patterns of green Gb and blue B filters are used in alternate columns. To enhance luminance resolution, green G (Gr or Gb) filters may be used in every column, and red R and blue B filters may be used in alternate columns.

In the image sensor 100 having the pixel structure of FIG. 2, the APS array 110 detects light using a photodiode, and converts the light to an electrical signal to generate an image signal. The image signal which is output from the APS array 110 comprises red R, green Gr and Gb, and blue B analog signals. The first ADC 150 including the CDS circuit array 130 converts an analog signal which is output from the APS array 110 to a digital signal according to a CDS method.

Figure 3:
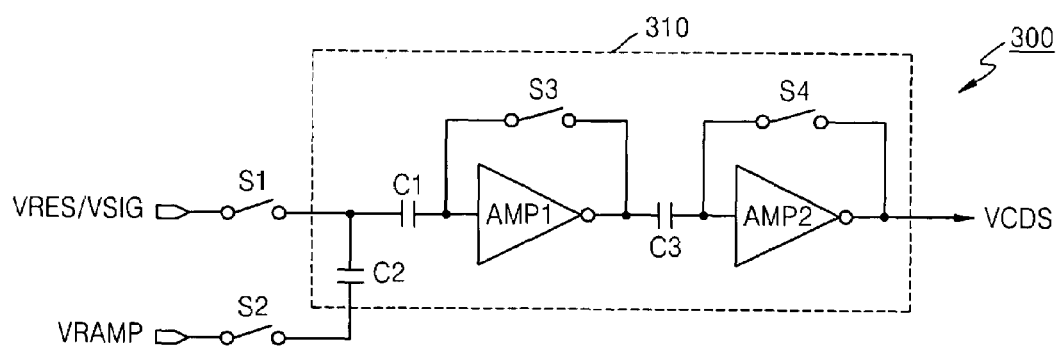
FIG. 3 shows a unit correlated double sampling (CDS) circuit for each column of the CDS circuit array of FIG. 1, according to an exemplary embodiment of the present invention.

FIG. 3 shows a unit CDS circuit 300 for each column of the CDS circuit array 130 of FIG. 1, according to an exemplary embodiment of the present invention. Referring to FIG. 3, the unit CDS circuit 300 includes switches S1 to S4, capacitors C1 to C3, a first amplifier AMP1, and a second amplifier AMP2.

The APS array 110 includes a photodiode for each pixel. From each of the pixels which are sequentially selected in response to a column selection signal SEL generated by the row driver 120, the APS array 110 outputs a reset signal VRES and an image signal VSIG that is detected by the photodiode, to a unit CDS circuit 300. The unit CDS circuit 300 generates a pulse width signal VCDS corresponding to the difference between the image signal VSIG and the reset signal VRES by using a ramp signal VRAMP. For example, when the reset signal VRES is input to the unit CDS circuit 300 from the APS array 110, the switches S1 to S4 are all turned on. When the image signal VSIG detected by the photodiode located in each pixel of the APS array 110 is input to the CDS circuit 300, only the switches S1 and S2 are turned on. Information of the image signal VSIG relative to the reset signal VRES is stored in the capacitors C1 and C2.

Figure 4:
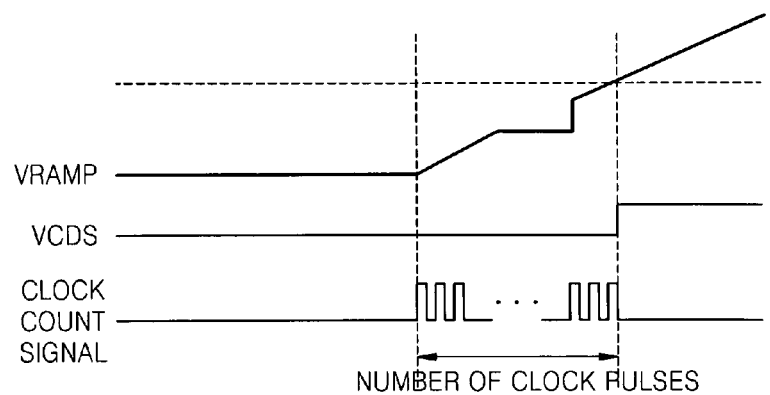
FIG. 4 illustrates a method of generating a digital code for an analog-to-digital converter of FIG. 1, according to an exemplary embodiment of the present invention.

FIG. 4 shows a method of generating a digital code for an analog-to-digital converter of FIG. 1, according to an exemplary embodiment of the present invention. Referring to FIG. 4, the ramp signal VRAMP is activated with the switches S1, S3, and S4 being turned off, and the switch S2 being turned on. As the ramp signal VRAMP increases in response to a comparison operation of the first amplifier AMP1, starting from when the ramp signal VRAMP is activated, the input of the first amplifier AMP1 increases due to a coupling effect of the capacitors C1 and C2. When the input of the first amplifier AMP1 becomes larger than the logic threshold voltage (VTH) of the first amplifier AMP1, an output voltage VDS of FIG. 3 is triggered from a logic "low" to "high" level. The larger the difference between the reset signal VRES and the image signal VSIG generated in the APS array 110, the slower the triggering of the output signal VCDS of the CDS circuit 300.

In an exemplary embodiment of the present invention, the first ADC 150 uses a single-slope architecture. The first ADC 150 uses a digital output code of the counter 151 as a reference clock count, corresponding to the timing for triggering the output voltage VDS of the CDS circuit 300 starting from when the ramp signal VRAMP is activated.

Referring to FIGS. 1 and 3, the first ADC 150 includes the counter 151 and the latch circuit array 152. The latch circuit array 152 receives an output of the CDS circuit 300 for each column. When a second ramp signal VRAMP2 is activated and increased, the counter 151 starts counting the number of clock pulses until the output signal VCDS of the CDS circuit array 130 is triggered from logic "low" to "high". Each column circuit of the latch circuit array 152 stores a digital count value of the counter 151. This operation is carried out for each horizontal scan period, in which the column selection signal SEL generated by the row driver 120 selects each column of the APS array 110. The digital signal stored in the latch circuit array 152 may be processed in a processor in the next stage to drive a display apparatus such as a liquid crystal display (LCD).

The ramp signal generator 140, according to an exemplary embodiment of the present invention calibrates the slope of a second ramp signal VRAMP2 used in the CDS circuit array 130 in a non-linear manner in response to illumination. To prevent the maximum dynamic range of the sensor from decreasing, which occurs when the slope of a linear ramp signal is controlled by analog gain control in a CIS using the first ADC 150, the analog gain has to be large under low illumination and small under high illumination, to prevent data loss even when the scene dynamic range is equal to the maximum sensor dynamic range. In a method of auto-calibrating the slope of a ramp signal in an analog manner, according to an exemplary embodiment of the present invention, the gain can be decreased for shadow data (low illumination), without data loss for highlight data (high illumination).

Figure 5:
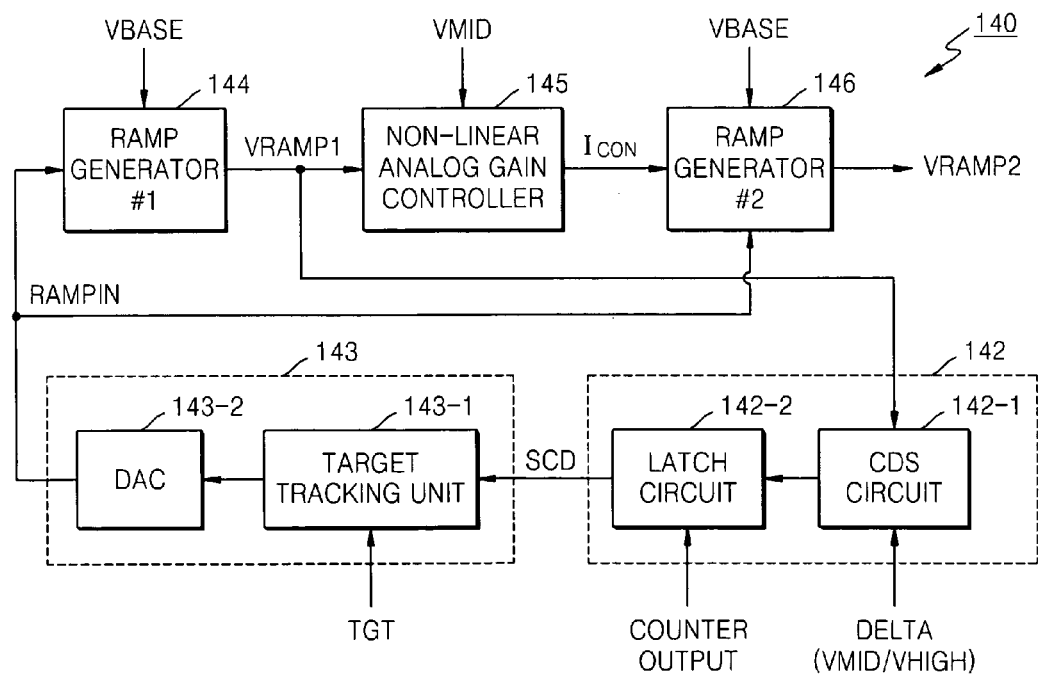
FIG. 5 is a block diagram of the ramp signal generator of FIG. 1, according to an exemplary embodiment of the present invention.

FIG. 5 is a block diagram of the ramp signal generator 140 of FIG. 1, according to an exemplary embodiment of the present invention. Referring to FIG. 5, the ramp signal generator 140 includes a second ADC 142, a tracking unit 143, a first ramp generator 144, a non-linear analog gain controller 145, and a second ramp generator 146. In an exemplary embodiment of the present invention, the second ADC 142 uses a single-slope architecture.

The second ADC 142 includes a CDS circuit 142-1, a latch circuit 142-2, and a common counter 151. The CDS circuit 142-1, the latch circuit 142-2, and the common counter 151 may have substantially the same structure as the CDS circuit shown in FIG. 3. The latch circuit 142-2 may have substantially the same structure as the latch circuits of the latch circuit array 152 of FIG. 1. The CDS circuit 142-1 samples the reference CDS analog input voltages DELTA, or VLOW and VHIGH. In each calibration process, the slope of the calibrated first ramp signal VRAMP1 to be fed back changes until it converges on a target slope. The second ADC 142 stores the digital output code of the counter, e.g., common counter 151, in the latch circuit 142-2 when the output voltage of the CDS circuit 142-1 changes, starting from when the first ramp signal VRAMP1 is activated, using the calibrated first ramp signal VRAMP1 starting from when the first ramp signal VRAMP 1 is activated.

The tracking unit 143 includes a target tracking unit 143-1 and a DAC 143-2. The target tracking unit 143-1 compares a digital target code TGT with the reference code SCD to generate a digital value based on the comparison result. The DAC 143-2 converts the generated digital value into an analog value to generate a ramp input signal RAMPIN to be supplied to the first ramp generator 144 and the second ramp generator 146. The first ramp generator 144 generates the first ramp signal VRAMP1 to be supplied to the non-linear analog gain controller 145 and the second ramp generator 146.

The digital target code TGT, which is input to the target tracking unit 143-1, may have a constant value in the middle of the digital data range. A next stage processor is controlled by gain control signals GC1, GC2, . . . GCN which are input to the non-linear analog gain controller 145 of FIG. 5. When an image sensor using the single slope ADC of FIG. 1 is used, the first ramp signal VRAMP1 has a constant slope since the first ramp signal VRAMP1 is linear, but the slope of the second ramp signal VRAMP2 varies depending on illumination conditions. The reference code SCD, which is generated in response to the reference analog voltages DELTA, or VMID and VHIGH that are input to the CDS circuit 142-1, converges on the digital target code TGT. The target tracking unit 143-1 sets the reference code SCD, which is generated by the second ADC 142, equal to the digital target code TGT. The reference CDS voltages DELTA, or VMID and VHIGH may have values in the middle of the digital range and may be sampled by the CDS circuit 142-1.

Figure 6:
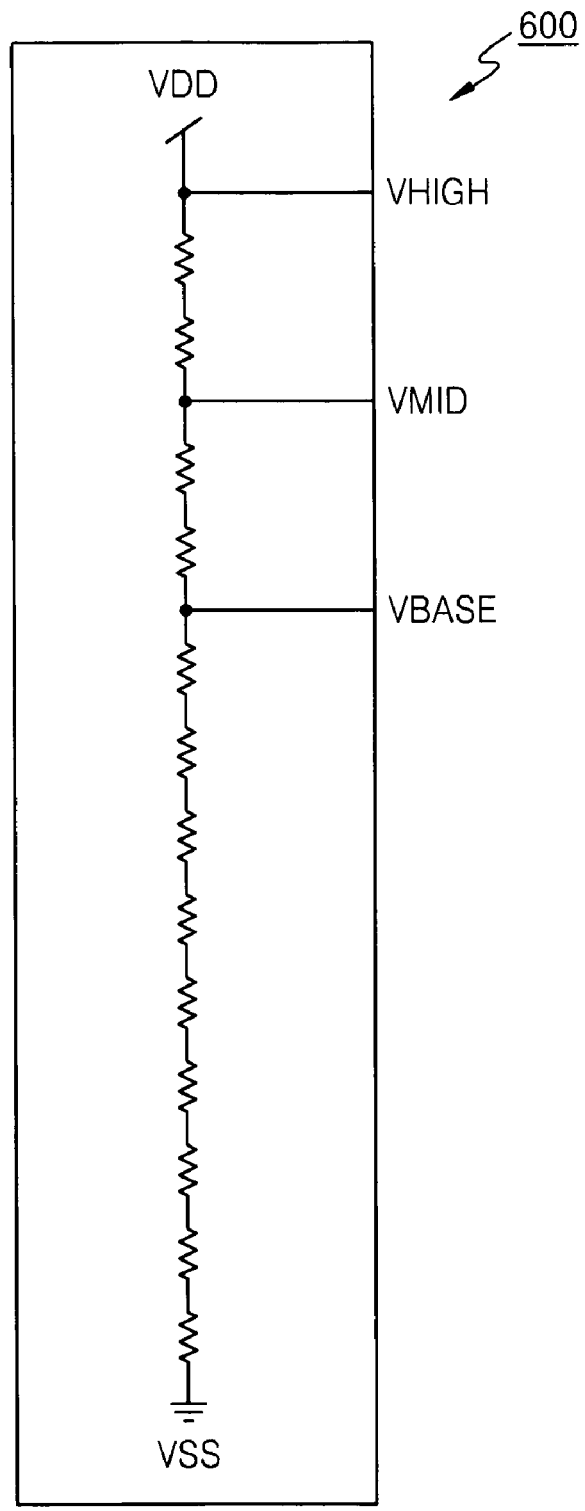
FIG. 6 shows an analog input circuit composed of a single-slope ADC, a non-linear analog gain controller, and ramp generators of FIG. 5, according to an exemplary embodiment of the present invention.
Figure 10:
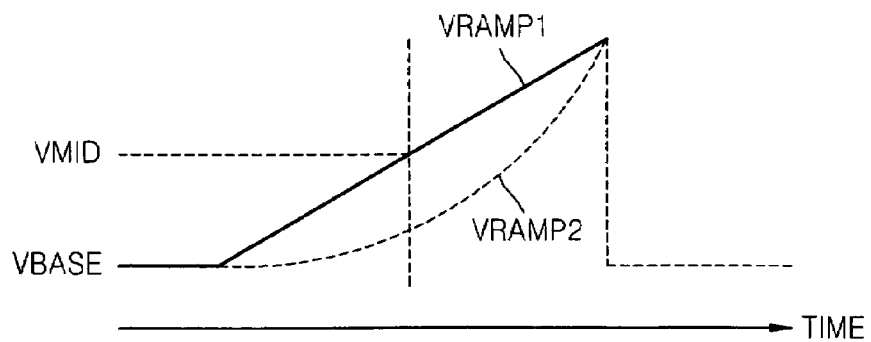
FIG. 10 is a graph showing a ramp signal slope varying with respect to the output current of the non-linear analog gain controller of FIG. 5, according to an exemplary embodiment of the present invention.

FIG. 6 shows an analog input circuit 600 which includes the second ADC 142, the non-linear analog gain controller 145, and ramp generators of FIG. 5. Referring to FIG. 6, the analog input circuit 600 comprises a band gap reference (BGR) circuit to avoid interference from power source noise. A plurality of resistors is connected in series between a BGR output and ground. The voltages divided by the resistors may be used as the reference analog voltages DELTA, or VMID and VHIGH input to the CDS circuit 142-1, a median voltage VMID used in the operation of the non-linear analog gain controller 145, and a base voltage VBASE used in the operations of the first ramp generator 144 and the second ramp generator 146. The median voltage VMID corresponds to a median level of voltages VHIGH and VBASE, and is equal to the median amplitude of the first ramp signal VRAMP1, as shown in FIG. 10. In an exemplary embodiment of the present invention, some of the voltages divided by the resistor string are used to meet a target slope of the first ramp signal VRAMP1 for each color channel. When various analog input voltages are supplied using the BGR circuit and the single resistor string circuit, the input voltages become less sensitive to power supply noise and temperature changes.

Referring to FIG. 5, the first ramp generator 144 generates the first ramp signal VRAMP1 calibrated based on the ramp input signal RAMPIN to be supplied to the non-linear analog gain controller 145 and the auto-calibrating second ADC 142. The non-linear analog gain controller 145 generates a folding current $I_{CON}$ by referencing the first ramp signal VRAMP1 and the median voltage VMID equal to the median amplitude of the first ramp signal VRAMP1. The second generator 146 generates the second ramp signal VRAMP2 based on the folding current $I_{CON}$ and the ramp input signal RAMPIN, and outputs the second ramp signal VRAMP2 to the CDS circuit array 130.

Figure 7:
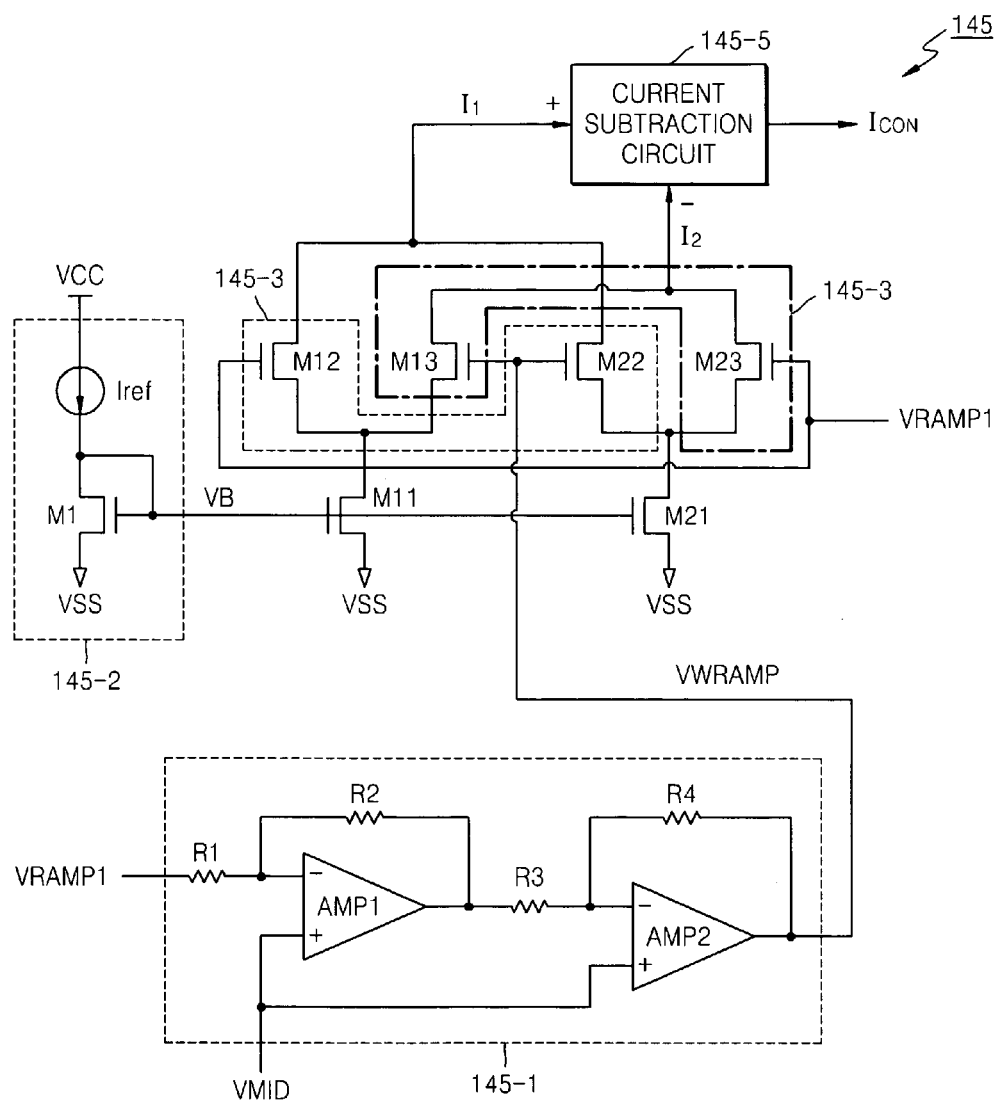
FIG. 7 is a circuit diagram of the non-linear analog gain controller of FIG. 5, according to an exemplary embodiment of the present invention.

FIG. 7 is circuit of the non-linear analog gain controller 145 of FIG. 5, according to an exemplary embodiment of the present invention. The non-linear analog gain controller 145 includes an input calibration unit 145-1, a bias circuit 145-2, a first current generator 145-3, a second current generator 145-4, and a current subtraction circuit 145-5.

The bias circuit 145-2 includes a current source Iref and a MOSFET M1, and generates a reference bias voltage VB to maintain a constant current Iref between a power source VCC and ground VSS. The input calibration unit 145-1 includes a first amplifier AMP1, a second amplifier AMP2, and resistors R1 to R4. The input calibration unit 145-1 assigns a predetermined weighted value to the first ramp signal VRAMP1 of the first ramp generator 144 according to the resistors R1 to R4, and generates a calibrated input VWRAMP reflecting the weighted value around the median voltage VMID.

An output VWRAMP of the input calibration unit 145-1 may be used as the median voltage VMID without the weighted value. The calibrated input VWRAMP generated by the input calibration unit 145-1 is output to the first current generator 145-3 and the second current generator 145-4.

The first current generator 145-3 includes MOSFETs M12 and M22, and generates a first current $I_1$ based on the first ramp signal VRAMP1, the calibrated input VWRAMP, and the bias voltage VB. The second current generator 145-4 includes MOSFETs M23 and M13, and generates a second current $I_2$ based on the first ramp signal VRAMP1, the calibrated input VWRAMP, and the bias voltage VB. As shown in FIG. 7, the MOSFETs M12 and M22 used in generating the first current $I_1$ and the MOSFETs M23 and M13 used in generating the second current $I_2$ are electrically connected. The MOSFETs M11 and M21 receiving the bias voltage VB may be of equal size, and the MOSFETs M12 and M13 and the MOSFETs M22 and M23 may be of equal size. According to an exemplary embodiment of the present invention, the MOSFETs M22 and M23 are larger than the MOSFETs M12 and M13 and generate the folding current $I_{CON}$ using the difference between the first current $I_1$ and the second current $I_2$. To use the conductance gm difference between the MOSFETs, when generating the first current $I_1$, the MOSFET M22 receiving the calibrated input VWRAMP has to be larger than the MOSFET M12 receiving the first ramp signal VRAMP1, and when generating the second current $I_2$, the MOSFET M23 receiving the first ramp signal VRAMP1 has to be larger than the MOSFET M13 receiving the calibrated input VWRAMP.

The current subtraction circuit 145-5 subtracts the second current $I_2$ from the first current $I_1$ to generate the folding current $I_{CON}$. According to the first ramp signal VRAMP1, the calibrated input VWRAMP which is output from the input calibration unit 145-1, and the polarity and magnitude of a subtraction result based on a comparison with the median voltage VMID, the output current $I_{CON}$ is folded. The polarity of the subtraction result between the first current $I_1$ and the second current $I_2$ is inverted when the difference between the first ramp signal VRAMP1 and the calibrated input VWRAMP is inverted.

Figure 8:
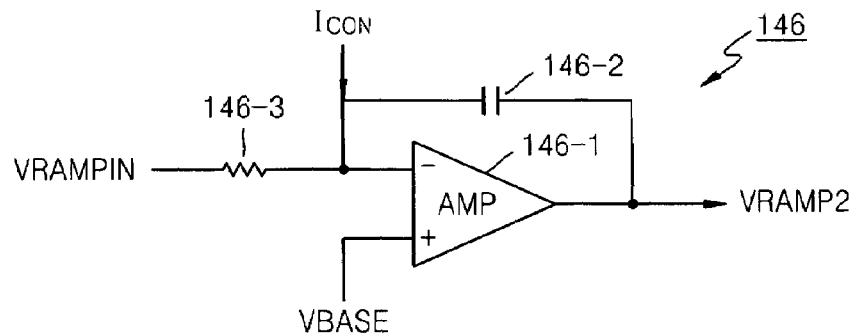
FIG. 8 is a circuit diagram of the second ramp generator of FIG. 5, according to an exemplary embodiment of the present invention.

FIG. 8 is a circuit diagram of the second ramp generator 146 of FIG. 5, according to an exemplary embodiment of the present invention. Referring to FIG. 8, the second ramp generator 146 includes an amplifier 146-1, a capacitor 146-2, a resistor 146-3, and a reset switch. The amplifier 146-1 operates in response to an input of the base analog voltage VBASE and the ramp input signal RAMPIN from the tracking unit 143 to output the second ramp signal VRAMP2. The capacitor 146-2 and the reset switch connected between input and output nodes of the amplifier 146-1. The resistor 146-3 generates an integral current $I_{in}$ and is connected between the ramp input signal RAMPIN node and the amplifier 146-1 input node. The switch 146-4 controls an enable time of the ramp signal VRAMP for every logic low.

In an exemplary embodiment of the present invention, to generate a non-linear ramp signal for implementing a non-linear analog gain, the folding current $I_{CON}$ obtained from the current subtraction circuit 145-5 is applied to the second ramp generator 146.

Figure 9:
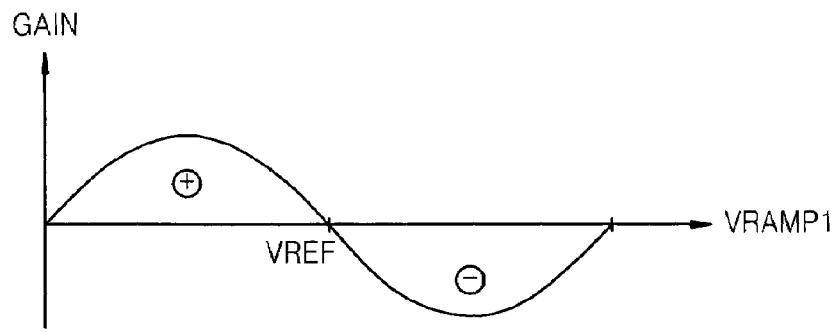
FIG. 9 is a graph of output current characteristics of the non-linear analog gain controller with respect to the output of the first ramp generator of FIG. 5, according to an exemplary embodiment of the present invention.

FIG. 9 is a graph of output current characteristics of the non-linear analog gain controller with respect to the output of the first ramp generator of FIG. 5, according to an exemplary embodiment of the present invention. For example, in a section where the first ramp signal VRAMP1 input to the non-linear analog gain controller 145 is positive as shown in FIG. 9, but smaller than the median voltage VMID, when the folding current $I_{CON}$ from the current subtraction circuit 145-5 is applied to the second ramp generator 146, the slope of the second ramp signal VRAMP2 becomes smaller, as shown in FIG. 10. In a section where the first ramp signal VRAMP1 is negative as shown in FIG. 9, but larger than the median voltage VMID, when the folding current ICON from the current subtraction circuit 145-5 is output from the second ramp generator 146, the slope of the second ramp signal VRAMP2 becomes larger, as shown in FIG. 10. That is, the slope of the second ramp signal VRAMP2 may be small in low illumination portions but large in high illumination portions, and a digital code generated by the first ADC 150 of FIG. 1 may be divided into a wide gray scale of low illumination data and a narrow gray scale of high illumination data. According to exemplary embodiments of the present invention, even when the gain increases to emphasize the data of the low illumination portion, the scene dynamic range can stay within the maximum dynamic range, without data loss in the high illumination portion.

As described above, the image sensor 100 according to an exemplary embodiment of the present invention generates the folding currents $I_{CON}$ for a voltage higher than the median voltage and a voltage lower than the median voltage VMID, respectively, by referencing the first ramp signal VRAMP1 that is calibrated by the first ramp generator 144 and the median voltage VMID equal to the median amplitude of the calibrated first ramp signal VRAMP1.

The second ramp generator 146 generates the non-linear second ramp signal VRAMP2 in response to the folding current $I_{CON}$ to be supplied to the first ADC 150.

An image sensor according to an exemplary embodiment of the present invention can brighten shadows (low illumination) without data loss in highlights (high illumination) using a folding current $I_{CON}$ of a non-linear analog gain controller, and a high quality display image with an optimum luminance can be achieved in any screen configuration, such that a maximum dynamic range of a sensor is not affected under any gain control conditions, thereby allowing analog gamma compensation without quality deterioration.

An image sensor according to an exemplary embodiment of the present invention allows higher frame rates. Gain control through a conventional ramp slope control is also possible if needed.

Although the exemplary embodiments of embodiments of the present invention have been described in detail with reference to the accompanying drawings for the purpose of illustration, it is to be understood that the inventive processes and apparatus should not be construed as limited thereby. It will be readily apparent to those of reasonable skill in the art that various modifications to the foregoing exemplary embodiments may be made without departing from the scope of the invention as defined by the appended claims, with equivalents of the claims to be included therein.

What is claimed is:

1. An image sensor comprising:
an active pixel sensor (APS) array including a plurality of pixels arranged in a two-dimensional matrix, wherein the APS array generates a reset signal and an image signal for each pixel of selected columns;
a first analog-to-digital converter (ADC) including correlated double sampling (CDS) circuits for each column of the APS array, wherein the first ADC generates a digital code corresponding to a difference between the reset signal and the image signal using an output ramp signal that is applied to the CDS circuits for each column; and
a ramp signal generator generating the output ramp signal based on folding currents generated for different voltage levels to correspond to a low illumination portion and a high illumination portion having different slopes.

2. The image sensor of claim 1, wherein the APS array is arranged in a Bayer pattern.

3. The image sensor of claim 1, wherein the ramp signal generator decreases the slope of the output ramp signal in the low illumination portion and increases the slope of the output ramp signal in the high illumination portion.

4. The image sensor of claim 3, wherein the output ramp signal represents a maximum sensor dynamic range regardless of a gain control condition.

5. The image sensor of claim 1, wherein the ramp signal generator generates folding currents for a voltage higher than a median voltage and a voltage lower than the median voltage, respectively, by referencing a calibrated ramp signal and a median voltage corresponding to a half amplitude of the calibrated ramp signal.

6. The image sensor of claim 1, wherein the ramp signal generator generates a reference code that is a digital code corresponding to reference CDS input voltages by receiving a feedback of the calibrated ramp signal using a second CDS circuit, and generates the calibrated ramp signal as a result of a comparison of a digital target code with the reference code.

7. The image sensor of claim 6, wherein the digital target code is data indicating a median value of a maximum range of the digital code.

8. The image sensor of claim 6, wherein the reference CDS input voltages are generated by an exclusive band gap reference circuit generating the reference code.

9. The image sensor of claim 6, wherein the reference CDS input voltages comprise a first voltage and a second voltage, and wherein at least one of the first voltage or the second voltage is equal to the median voltage.

10. The image sensor of claim 8, wherein a base voltage used in generating the ramp signals, the first and second voltages, the median voltage, and an input voltage required for each color channel are supplied from voltages divided by a single resistor string.

11. An image sensor comprising:
an active pixel sensor (APS) array including a plurality of pixels arranged in a two-dimensional matrix, wherein the APS array generates a reset signal and an image signal for each pixel of selected columns;
a first analog-to-digital converter (ADC) including correlated double sampling (CDS) circuits for each column of the APS array, wherein the first ADC generates a digital code corresponding to a difference between the reset signal and the image signal using an output ramp signal that is applied to the CDS circuits for each column; and
a ramp signal generator generating the output ramp signal in which a low illumination portion and a high illumination portion have different slopes,
wherein the ramp signal generator includes:
a second ADC generating a reference code using a feedback of a calibrated ramp signal;
a tracking unit generating an analog ramp input signal as a result of a comparison of a digital target code with the reference code;
a first ramp generator generating the calibrated ramp signal based on the ramp input signal;
a non-linear analog gain controller generating folding currents for a voltage higher than a median voltage and a voltage lower than the median voltage, respectively, based on the first ramp signal and the median voltage equal to the median amplitude of the first ramp signal; and
a second ramp generator generating the output ramp signal based on the folding current and the ramp input signal.

12. The image sensor of claim 11, wherein the second ramp generator comprises an amplifier, a capacitor connected between an input and output of the amplifier, and a resistor outputting the ramp input signal and a substantially constant current between amplifier inputs, and wherein the second ramp generator operates by receiving inputs of the base voltage and the ramp input signal.

13. The image sensor of claim 11, wherein the non-linear analog gain controller decreases the slope of the output ramp signal by supplying the folding current to the second ramp generator when the first ramp signal is smaller than the median voltage, and wherein the non-linear analog gain controller increases the slope of the output ramp signal by extracting the folding current from the second ramp generator when the first ramp signal is larger than the median voltage.

14. The image sensor of claim 11, wherein the non-linear analog gain controller comprises:
a bias circuit generating a bias voltage;
an input calibration unit generating a calibrated input of a median voltage using a predetermined weighted value for the first ramp signal;
a first current generator generating a first current based on the first ramp signal, the calibrated input, and the bias voltage;
a second current generator generating a second current based on the first ramp signal, the calibrated input, and the bias voltage; and
a current subtraction circuit generating the folding current by subtracting the second current from the first current.

15. The image sensor of claim 14, wherein the folding current is folded when the polarity of a difference between the calibrated input signal and the first ramp signal is inverted.

16. The image sensor of claim 14, wherein a first plurality of transistors that receive the calibrated input are used in generating the first current and the second current, and wherein a second plurality of transistors that receive the first ramp signal are used in generating the first current and the second current.

17. The image sensor of claim 16, wherein, when the first current is generated, the transistors receiving the calibrated input are larger than the transistors receiving the first ramp signal, and wherein, when the second current is generated, the transistors receiving the first ramp signal are larger than the transistors receiving the calibrated input.

18. The image sensor of claim 11, wherein the non-linear analog gain controller controls a current driving capability of transistors used in generating the first and second currents using a switch, wherein the switch is operable to control the magnitude of a folding current generated by the current subtraction circuit.

19. A method of driving an image sensor, comprising:
generating a reset signal and an image signal for each pixel of a selected column in an active pixel sensor (APS) array including a plurality of pixels arranged in a two-dimensional matrix;
generating a pulse width signal corresponding to a difference between the rest signal and the image signal using an output ramp signal in correlated double sampling (CDS) circuits of each column of the APS array, and generating digital data corresponding to the pulse width signal;
generating a reference code that is a digital code corresponding to reference analog input voltages by receiving feedback of a calibrated ramp signal;
generating the calibrated ramp signal as a result of a comparison of a digital target code, the digital target code being equal to a median value in the digital code range, with the reference code;
generating a folding current using the calibrated ramp signal and a non-linear analog gain controller; and
generating the output ramp signal by applying the folding current to a ramp generator.

20. The method of claim 19, wherein the APS array is arranged in a Bayer pattern.

21. The method of claim 19, wherein a slope of the output ramp signal is small in the low illumination portion, and the slope of the output ramp signal is large in the light illumination portion.

22. The method of claim 19, further comprising:
generating folding currents for a voltage higher than a median voltage and a voltage lower than the median voltage, respectively, by referencing a calibrated ramp signal and a median voltage corresponding to a half amplitude of the calibrated ramp signal; and
generating the output ramp signal based on the folding current.

23. The method of claim 19, further comprising:
generating a reference code that is a digital code corresponding to reference correlated double sampling (CDS) input voltages by receiving feedback of the calibrated ramp signal using another CDS circuit; and
generating the calibrated ramp signal as a result of a comparison of a digital target code with the reference code.

24. The method of claim 23, wherein the digital target code is data indicating a median value of a maximum range of the digital code.

25. The method of claim 23, wherein the reference CDS input voltages are generated by an exclusive band gap reference circuit generating the reference code.

26. The method of claim 23, wherein the reference CDS input voltages comprise a first voltage and a second voltage, and any one of the first voltage and the second voltage is equal to the median voltage.

27. The method of claim 23, wherein a base voltage used in generating the ramp signals, the first and second voltages, the median voltage, and an input voltage required for each color channel are supplied from voltages divided by a single resistor string.

28. The method of claim 19, wherein generating the output ramp signal comprises:
generating a reference code corresponding to reference CDS analog input voltages by receiving a feedback of a calibrated ramp signal;
generating an analog ramp input signal as a result of a comparison of a digital target code with the reference code;
generating the calibrated ramp signal based on the ramp input signal;
generating folding currents for a voltage higher than a median voltage and a voltage lower than the median voltage, respectively, based on the first ramp signal and the median voltage corresponding to a half amplitude of the first ramp signal; and
generating the output ramp signal based on the folding current and the ramp input signal.

29. The method of claim 28, wherein when the first ramp signal is smaller than the median voltage, the slope of the output ramp signal decreases in response to the folding current, and when the first ramp signal is larger than the median voltage, the slope of the output ramp signal increases by extracting the folding current.

30. The method of claim 28, wherein when the first ramp signal is smaller than the median voltage, a gain of an ADC used in generating the output ramp signal increases, and when the first ramp signal is larger than the median voltage, the gain of the ADC used in generating the output ramp signal decreases.

31. The method of claim 28, wherein generating the folding current comprises:
generating a bias voltage;
generating a calibrated input of a median voltage using a predetermined weighted value for the first ramp signal;
generating a first current based on the first ramp signal, the calibrated input, and the bias voltage;
generating a second current based on the first ramp signal, the calibrated input, and the bias voltage; and
generating a folding current by subtracting the second current from the first current.

32. The method of claim 31, wherein the folding current is folded when the polarity of a difference between the calibrated input signal and the first ramp signal is inverted.

33. The method of claim 31, wherein a first plurality of transistors of that receive the calibrated input are used in generating the first current and the second current, and a second plurality of transistors that receive the first ramp signal are used in generating the first current and the second current.

34. The method of claim 33, wherein, when the first current is generated, the transistors receiving the calibrated input are larger than the transistors receiving the first ramp signal, and wherein, when the second current is generated, the transistors receiving the first ramp signal are larger than the transistors receiving the calibrated input.

35. The method of claim 28, wherein in the generating of the folding current, a current driving capability of transistors used in generating the first and second currents are controlled using a switch, wherein the switch is operable to control the magnitude of a folding current generated by the current subtraction circuit.

* * * * *